(12) United States Patent
Seto

(10) Patent No.: US 7,872,500 B2
(45) Date of Patent: Jan. 18, 2011

(54) SEMICONDUCTOR DEVICE

(75) Inventor: Tadao Seto, Chiba (JP)

(73) Assignee: Kabushiki Kaisha Toshiba, Toyko (JP)

( * ) Notice: Subject to any disclaimer, the term of this patent is extended or adjusted under 35 U.S.C. 154(b) by 0 days.

(21) Appl. No.: 12/362,644

(22) Filed: Jan. 30, 2009

(65) Prior Publication Data
US 2009/0189640 A1      Jul. 30, 2009

(30) Foreign Application Priority Data
Jan. 30, 2008    (JP) .............................. 2008-019304

(51) Int. Cl.
*H03K 19/0175*    (2006.01)
(52) U.S. Cl. .............................. 326/81; 326/68; 326/80
(58) Field of Classification Search ................. 365/266, 365/227
See application file for complete search history.

(56) References Cited

U.S. PATENT DOCUMENTS

| | | | | |
|---|---|---|---|---|
| 4,471,242 A | * | 9/1984 | Noufer et al. | 326/71 |
| 4,853,560 A | * | 8/1989 | Iwamura et al. | 326/80 |
| 5,151,622 A | * | 9/1992 | Thrower et al. | 326/71 |
| 6,229,365 B1 | * | 5/2001 | Iketani et al. | 327/170 |
| 6,803,632 B2 | | 10/2004 | Kato | |
| 7,106,562 B2 | | 9/2006 | Kitagawa | |
| 7,307,822 B2 | | 12/2007 | Kitagawa et al. | |
| 2006/0279334 A1 | * | 12/2006 | Correale et al. | 326/81 |

FOREIGN PATENT DOCUMENTS

JP     2000-260948     9/2000
JP     2004-119883     4/2004

OTHER PUBLICATIONS

SETO, U.S. Appl. No. 09/523,554, filed Mar. 10, 2000, 25 pgs.

* cited by examiner

*Primary Examiner*—Anh Q Tran
(74) *Attorney, Agent, or Firm*—Sprinkle IP Law Group

(57) ABSTRACT

According to an aspect of the present invention, there is provided a semiconductor device including: a first circuit portion including: a first circuit that is connected between a first high-side power line and a low-side power line and that outputs a second signal based on a first signal input thereto; and a second circuit portion including: a first transistor that is connected between a second high-side power line and a node and that has a normally-on characteristic; a second circuit that is connected between the node and the low-side power line and that outputs a third signal based on the second signal input thereto.

15 Claims, 5 Drawing Sheets

FIG. 3

| STANDBY MODE | NORMAL OPERATION MODE |
|---|---|
| PT2 "ON" <br> PT3 "OFF" | PT2 "ON" <br> PT3 "ON" |
| LARGE IMPEDANCE AT NODE N1 | SMALL IMPEDANCE AT NODE N1 |
| LARGE ESD WITHSTANDING CAPABILITY AT SECOND CIRCUIT PORTION | FAVOURABLE CHARACTERISTICS AT SECOND CIRCUIT PORTION |

US 7,872,500 B2

SEMICONDUCTOR DEVICE

CROSS-REFERENCE TO RELATED APPLICATIONS

This application claims priority from Japanese Patent Application No. 2008-019304 filed on Jan. 30, 2008, the entire contents of which are incorporated herein by reference.

BACKGROUND OF THE INVENTION

1. Field of the Invention

An aspect of the present invention relates to a semiconductor device having a plurality of power domains.

2. Description of the Related Art

A system large scale integrated circuit (LSI), a system-on-a-chip (SoC), or a multi-chip package (MCP), which serves as a semiconductor device, is provided with circuit portions respectively belonging to a plurality of power domains that differ from one another. As the micromachining of semiconductor elements progresses, the number of elements integrated on a system LSI, a SoC, or an MCP and the number of circuit portions mounted thereon increase. Further, the need for use of the separated power domains increases. In a conventional semiconductor device having a plurality of separated power domains, an electrostatic discharge (ESD) protection countermeasure is needed for each of circuit portions that are independent in power supplies of one another (see, e.g., JP-2004-119883-A).

In the conventional semiconductor device described in, e.g., JP-2004-119883-A, the gate withstand voltage of a transistor of a second circuit portion belonging to a second power domain, to which a first signal output from a first circuit portion belonging to a first power domain is input, is set to be higher than that of each of other transistors thereof. As a result, the ESD withstanding capability of the second circuit portion is enhanced.

However, in the conventional semiconductor device, since a high gate-withstand-voltage transistor that is lower in the driving capability than the other transistors is provided at an input side of the second circuit portion, the characteristic of the second circuit portion is degraded.

SUMMARY OF THE INVENTION

According to an aspect of the present invention, there is provided a semiconductor device including: a first circuit portion including: a first circuit that is connected between a first high-side power line and a low-side power line and that outputs a second signal based on a first signal input thereto; and a second circuit portion including: a first transistor that is connected between a second high-side power line and a node and that has a normally-on characteristic; a second circuit that is connected between the node and the low-side power line and that outputs a third signal based on the second signal input thereto.

According to another aspect of the present invention, there is provided a semiconductor device including: a first circuit that is connected between a first high-side power line and a low-side power line and that sends a data signal; a protection circuit including: a first transistor that is connected between a second high-side power line and a node and that has a normally-on characteristic; a control circuit that is connected between the second high-side power line and the low-side power line and that outputs a control signal based on a voltage of the first high-side power line; and a second transistor that is connected between the second high-side power line and the node and that has a control terminal to which the control signal is input; and a second circuit that is connected between the node and the low-side power line and that receives the data signal.

According to still another aspect of the present invention, there is provided a method for designing a semiconductor device, the method including: disposing a first circuit that is connected between a first high-side power line and a low-side power line and that sends a data signal; disposing a protection circuit including a first transistor that is connected between a second high-side power line and a node and that has a normally-on characteristic; and disposing a second circuit that is connected between the node and the low-side power line and that receives the data signal.

BRIEF DESCRIPTION OF THE DRAWINGS

FIG. 3 is a table illustrating an operation of a second circuit portion according to Embodiment 2 of the invention.

DETAILED DESCRIPTION OF THE INVENTION

Hereinafter, embodiments of the invention are described with reference to the accompanying drawings.

Embodiment 1

Figure 1:
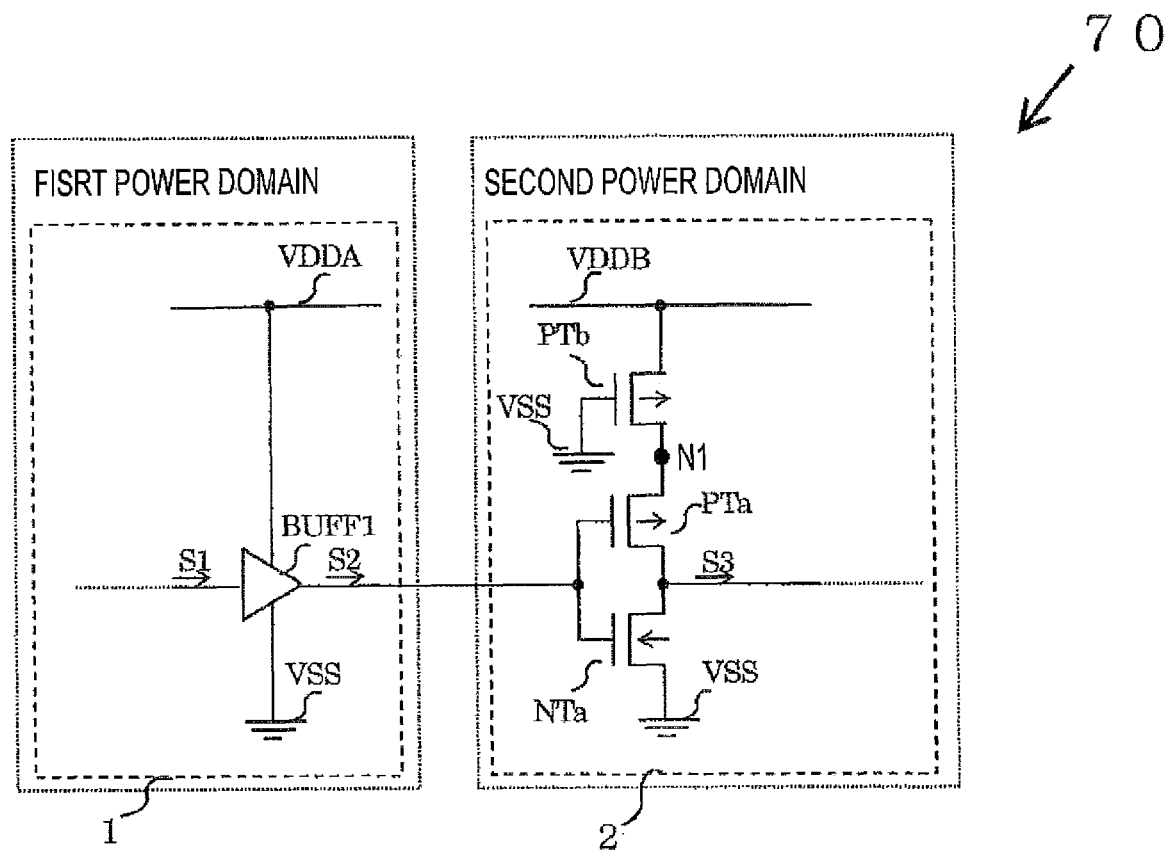
FIG. 1 is a circuit diagram illustrating a semiconductor device according to Embodiment 1 of the invention.

First, a semiconductor device according to Embodiment 1 of the invention is described below by referring to the accompanying drawings. FIG. 1 is a circuit diagram illustrating the semiconductor device. According to the present embodiment, a normally-on transistor is provided at a high-side power source side of an inverter that is provided in a receiving-side circuit portion.

As illustrated in FIG. 1, a semiconductor device 70 includes a first power domain and a second power domain, which are different power domains. The semiconductor device 70 is a system-on-a-chip (SoC) provided with, e.g., a memory, a logic circuit, an analog circuit and an input/output circuit. The first power domain includes a first (transmitting-side) circuit portion 1. The second power domain includes a second (receiving-side) circuit portion 2. The illustration and the description of an electrostatic discharge (ESD) protection circuit, which protects circuits and elements provided in the first power domain and the second power domain from static electricity, and third or later power domains are omitted herein.

The first circuit portion 1 includes a buffer circuit BUFF1. The buffer BUFF1 is provided between a high-side power source VDDA and a low-side power source VSS (at a ground level) of the first power domain. A first signal S1 which is produced in or out the first circuit portion is input to the buffer BUFF1. Then, the buffer BUFF1 outputs a second signal S2 obtained by driving the first signal S1.

The second circuit portion 2 includes an N-channel MOS (NMCS) transistor NTa, a P-channel MOS (PMOS) transistor PTa and a PMOS transistor PTb. Logic transistors that are relatively low in gate withstand voltage (referred also as a gate breakdown voltage) and are high in speed, are used as the NMOS transistor NTa, the PMOS transistor PTa and the PMOS transistor PTb.

The MOS transistor means a transistor having a gate insulating film formed of a silicon dioxide film, and is referred to also as a metal oxide semiconductor field effect transistor (MOSFET) A metal insulator semiconductor (MIS) transistor means a transistor having a gate insulting film formed of, e.g., a nitric oxide (NO) film or a high-K gate film other than silicon dioxide film, and is referred to also as a metal insulator semiconductor field effect transistor (MISFET). MOS transistors and MIS transistors are referred to also as insulated gate field effect transistor.

The PMOS transistor PTb is such that the source (second terminal) thereof is connected to a high-side power source VDDB of the second power domain which is different from the first power domain, and that the gate (control terminal) thereof is connected to a low-side power source VSS. The PMOS transistor PTb is a normally-on transistor (referred to also as a D-type transistor), which is always on when a VDDB-voltage is supplied thereto.

The PMOS transistor PTa is such that the source (second terminal) thereof is connected to the drain (first terminal) of the PMOS transistor PTb, and that a second signal S2 output from the buffer BUFF1 is input to the gate (control terminal) thereof. The NMOS transistor NTa is such that the drain (first terminal) thereof is connected to the drain (first terminal) of the PMOS transistor PTa, that a second signal S2 output from the buffer BUFF1 is input to the gate (control terminal) thereof, and that the source (second terminal) thereof is connected to the low-side power source VSS.

The PMOS transistor PTa and the NMOS transistor NTb constitute an inverter. A third signal S3 obtained by inverting the second signal S2 is output from the drain (first terminal) of each of the PMOS transistor PTa and the NMOS transistor NTb.

The PMOS transistor PTb is functioning as a protection circuit.

Next, an operation of the second circuit portion in a normal operation mode and in a standby mode is described below. The normal operation mode corresponds to a case where the VDDA-voltage of the first power domain is supplied to the first circuit portion 1, where the VDDB-voltage of the second power domain is supplied to the second circuit portion 2, and where the second signal S2 output from the buffer BUFF1 is input to the second circuit portion 2. The standby mode corresponds to a case where conditions for establishing the normal operation mode are not satisfied, e.g., a case where the VDDB-voltage is not supplied thereto.

In the normal operation mode of the second circuit portion 2, the VDDB-voltage is not applied to the inverter which includes the PMOS transistor PTa and the NMOS transistor NTa. A voltage applied thereto is lowered by a voltage whose value is calculated by multiplying the on-resistance Ronb of the PMOS transistor PTb by the current flowing in the PMOS transistor PTb.

On the other hand, in the standby mode of the second circuit portion 2, the source voltage of the PMOS transistor PTa is lowered from the VDDB-voltage by a voltage calculated by multiplying the on-resistance Ronb of the PMOS transistor PTb by the current flowing the PMOS transistor PTb.

In the present embodiment, the on-resistance Ronb of the PMOS transistor PTb is set at an appropriate value, and the logic transistors that are high in speed and relatively low in the gate withstand voltage are used as the NMOS transistor NTa and the PMOS transistor PTa. That is, ESD-withstanding transistors are not used as the transistors NTa and PTa. As a result, in the inverter consisting of the PMOS transistor PTa and the NMOS transistor NTa, a third signal S3 output therefrom is prevented from being deteriorated in the characteristics. For example, if the static electricity is added on a transmission line transmitting the second signal S2, the voltage difference between the gate and the source (node N1) of the PMOS transistor PTa constituting the inverter is reduced. As a result, the ESD withstanding capability of the second circuit portion 2 is enhanced.

As described above, the semiconductor device according to the present embodiment includes the first circuit portion 1 to which the VDDA-voltage of the first power domain is supplied, and the second circuit portion 2 to which the VDDB-voltage of the second power domain differing from the first power domain is supplied. The buffer BUFF1 is provided in the first circuit portion 1. The NMOS transistor NTa, the PMOS transistor PTa and the PMOS transistor PTb are provided in the second circuit portion 2. The normally-on PMOS transistor PTb is configured such that the source thereof is connected to the high-side power source VDDB. The inverter including the PMOS transistor PTa and the NMOS transistor NTa is provided between the drain of the PMOS transistor PT band the low-side power source Vss. Logic transistors that are relatively low in the gate with stand voltage and are high in speed are used as the NMOS transistor NTa and the PMOS transistor PTa.

In the normal operation mode, the voltage applied to the inverter including the PMOS transistor PTa and the NMOS transistor NTa is lowered from the VDDB-voltage by a voltage obtained by multiplying the on-resistance Ronb of the PMOS transistor PTb by the current flowing in the PMOS transistor PTb. In the standby mode, the source voltage level of the PMOS transistor PTa is lowered from the VDDB-voltage by a voltage obtained by multiplying the on-resistance Ronb of the PMOS transistor PTb by the current flowing in the PMOS transistor PTb. As a result, in the inverter consisting of the PMOS transistor PTa and the NMOS transistor NTa, an output signal is prevented from being deteriorated in the characteristics. For example, if the static electricity is added on a transmission line transmitting the second signal S2, the voltage difference between the gate and the source (node N1) of the PMOS transistor PTa constituting the inverter is reduced. As a result, the ESD withstanding capability of the second (receiving-side) circuit portion 2 is enhanced.

In the present embodiment, the normally-on PMOS transistor PTb is provided at the side of the high-side power source VDDB of the second circuit portion 2. However, the normally-on NMOS transistor whose gate is connected to the high-side power source VDDB may be used instead of the PMOS transistor PTb. Although the second signal S2 output from the first circuit portion 1 is input to the inverter including the PMOS transistor PTa and the NMOS transistor NTa, which is provided in the second circuit portion 2, the second signal S2 may be input to a logic gate, a sequential circuit, or an amplification circuit. Further, although the first circuit portion 1 and the second circuit portion 2 are constituted by MOS transistors, MIS transistors may be used instead of MOS transistors.

Embodiment 2

Figure 2:
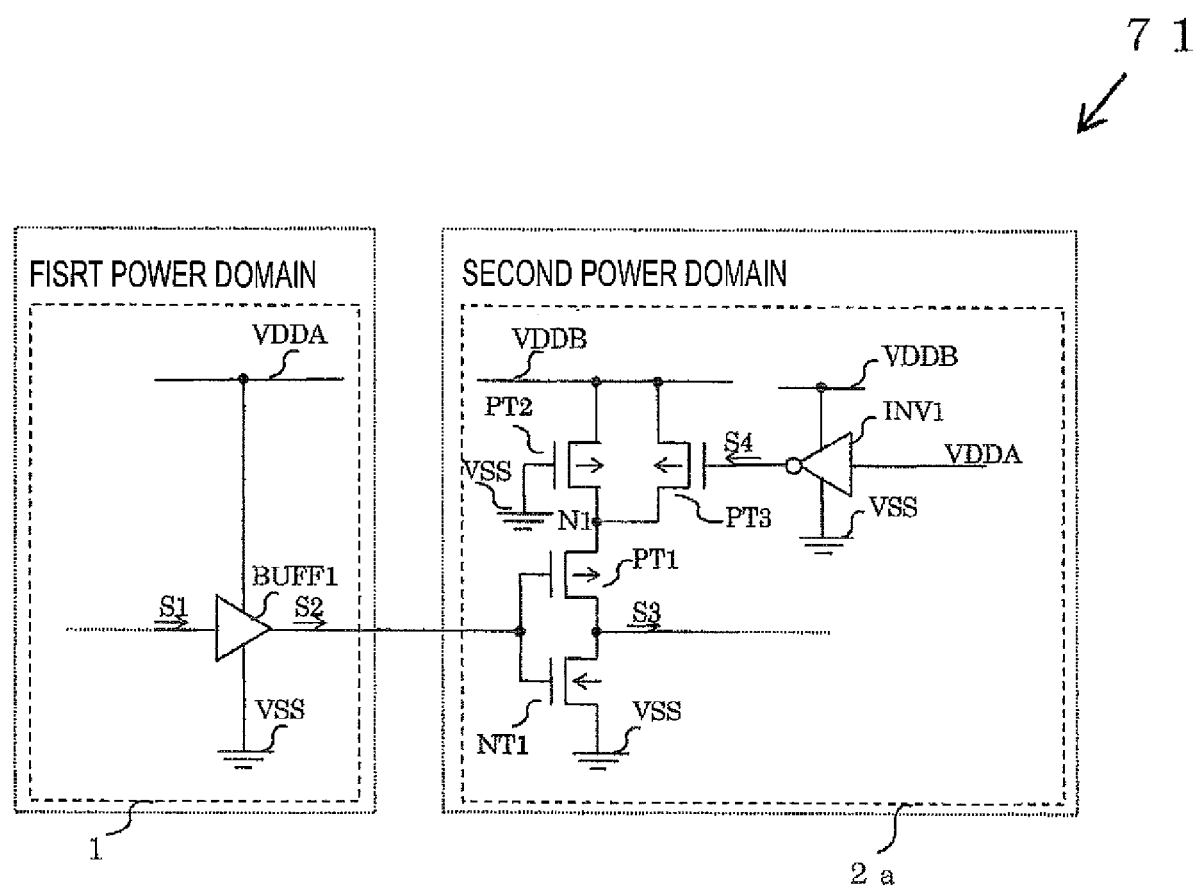
FIG. 2 is a circuit diagram illustrating a semiconductor device according to Embodiment 2 of the invention.

Next, a semiconductor device according to Embodiment 2 of the invention is described below by referring to the accompanying drawings. FIG. 2 is a circuit diagram illustrating the semiconductor device. According to the present embodiment, the impedance at the high-side power source side of a circuit provided in the receiving-side circuit portion is switched between the standby mode and the normal operation mode.

Hereinafter, each constituent element which is the same as that of Embodiment 1 is designated with the same reference numeral as that used in the description of Embodiment 1. Thus, the description of such constituent elements is omitted. In the following description, the differences between Embodiment 1 and Embodiment 2 are described below.

As illustrated in FIG. 2, a semiconductor device 71 includes a first power domain and a second power domain, which are different power domains. The semiconductor device 71 is a system-on-a-chip (SoC) provided with, e.g., a memory, a logic circuit, an analog circuit and an input/output circuit. The first power domain includes a first (transmitting-side) circuit portion 1. The second power domain includes a second (receiving-side) circuit portion 2a. The illustration and the description of an electrostatic discharge (ESD) protection circuit, which protects circuits and elements provided in the first power domain and the second power domain from static electricity, and third or later power domains are omitted herein.

The second circuit portion 2a includes an inverter INV1, an NMOS transistor NT1 and PMOS transistors PT1 to PT3.

The PMOS transistor PT2 is such that the source (second terminal) thereof is connected to a high-side power source VDDB of the second power domain which is different from the first power domain, that the gate (control terminal) thereof is connected to a low-side power source (at a ground level) VSS, and that the drain (first terminal) thereof is connected to a node N1. The PMOS transistor PT2 is a normally-on transistor (referred to also as a D-type transistor), which is always on when a VDDB-voltage is supplied thereto.

The PMOS transistor PT1 is such that the source (second terminal) thereof is connected to the node N1, and that a second signal S2 output from the buffer BUFF1 is input to the gate (control terminal) thereof. The NMOS transistor NT1 is such that the drain (first terminal) thereof is connected to the drain (first terminal) of the PMOS transistor PT1, that the second signal S2 output from the buffer BUFF1 is input to the gate (control terminal) thereof, and that the source (second terminal) thereof is connected to the low-side power source VSS.

The PMOS transistor PT1 and the NMOS transistor NT1 constitute an inverter. A third signal S3 obtained by inverting the second signal S2 is output from the drain (first terminal) of each of the PMOS transistor PT1 and the NMOS transistor NT1.

The PMOS transistor PT3 is such that the source (second terminal) thereof is connected to the high-side power source VDDB, that a fourth signal S4 is input to the gate (control terminal) thereof, and that the drain (first terminal) thereof is connected to the node N1. A PMOS transistor PT3 is turned on when the level of the fourth signal S4 is a "Low" level, while the PMOS transistor PT3 is turned off when the level of the fourth signal S4 is a "High" level.

The inverter INV1 is provided between the high-side power source VDDB and the low-side power source VSS. The VDDA-voltage is input to an input side of the inverter INV1. A fourth signal S4 obtained by inverting the VDDA-voltage signal is output from the inverter INV1 to the gate (control terminal) of the PMOS transistor PT3.

The inverter INV1 is functioning as a control circuit. The normally-on PMOS transistor PT2, the normally-off PMOS transistor PT3 and the inverter INV1 are functioning as a protection circuit.

The gate withstand voltage (referred to also as the gate breakdown voltage) of a transistor constituting the inverter INV1 is set to be higher than those of other transistors constituting the buffer BUFF1, the NMOS transistor NT1 and the PMOS transistors PT1 to PT3.

To enhance the gate withstand voltage of the transistor constituting the inverter INV1, the equivalent oxide thickness (EOT (referred to also as the effective film thickness)) of a gate insulating film thereof is set to be larger than those of gate insulating films of other transistors (constituting the buffer BUFF1, the NMOS transistor NT1 and the PMOS transistors PT1 to PT3).

For example, To enhance the gate withstand voltage, enlarging the size of the transistor constituting the inverter INV1, instead of increasing the EOT of the gate insulating film. An ESD protection element or the like may be provided at the input side of the inverter INV1.

In the present embodiment, the size of the PMOS transistor PT3 is set to be larger than that of the PMOS transistor PT2. For example, in a case where the gate length (Lg) of the PMOS transistor PT2 is equal to that of the PMOS transistor PT3, the gate width (Wg) of the PMOS transistor PT3 is set to be wider than that of the PMOS transistor PT2.

Next, an operation of the second (receiving-side) circuit portion is described with reference to FIG. 3. FIG. 3 illustrates an operation of the second circuit portion.

As is seen from FIG. 3, an operation in a normal operation mode of the PMOS transistor PT3 differs from that in a standby mode thereof in the second circuit portion 2a.

The normal operation mode corresponds to a case where the VDDA-voltage of the first power domain is supplied to the first circuit portion 1, where the VDDB-voltage of the second power domain is supplied to the second circuit portion 2a, where the second signal S2 output from the buffer BUFF1 is input to the second circuit portion 2, and where the VDDA-voltage is input to the inverter INV1.

The standby mode corresponds to a case where conditions for establishing the normal operation mode are not satisfied, e.g., a case where the VDDA-voltage is not input to the input side of the inverter INV1, or where the VDDB-voltage is not supplied thereto.

In the normal operation mode of the second circuit portion 2a, the signal level of the fourth signal S4 is an "Low" level, so that the PMOS transistor PT3 is turned on, and that the PMOS transistor PT2 is turned on.

The relationship between the on-resistance Ron2 of the PMOS transistor PT2 and that Ron3 of the PMOS transistor PT3 is set to be as follows.

$$Ron2 \gg Ron3 \qquad \text{expression (1)}$$

Thus, the resistance value Rreg of the resistance in the normal operation mode between the high-side power source VDDB and the node N1 is given as to satisfy the following expressions.

$$1/Rreg=(1/Ron2)+(1/Ron3) \qquad \text{expression (2)}$$

$$1/Rreg \approx 1/Ron3 \qquad \text{expression (3)}$$

Preferably, the on-resistance Ron2 of the normally-on PMOS transistor PT2 is set to be higher than that Ronb of the normally-on PMOS transistor PTb of Embodiment 1.

The on-resistance Ron3 of the PMOS transistor PT3 is set at a small value. Thus, the impedance at the node N1 can be set to be low. The voltage at the node N1 can be set to be substantially equal to the VDDB-voltage. Accordingly, reduction in the voltage applied to the inverter including the PMOS transistor PT1 and the NMOS transistor NT1 of the second circuit portion 2a is suppressed. In addition, the signal level reduction and the signal delay of the third signal S3 output from this inverter are suppressed, and given signal characteristics are maintained. As a result, the characteristics of the second circuit portion 2a are favorably maintained.

In the present embodiment, it is assumed that the on-resistance Ron2>>the on-resistance Ron3, as indicated by the expression (1). However, for example, the on-resistance Ron2 may be set to be substantially equal to the on-resistance Ron3. Even in this case, the combined resistance of the PMOS transistor PT2 and the PMOS transistor PT3 can be set to be lower than the on-resistance Ron2 of the PMOS transistor PT2. Consequently, the impedance at the node N1 can be set to be lower than that in the standby mode.

On the other hand, in the standby mode of the second circuit portion 2a, the signal level of the fourth signal S4 is a "High" level, so that the PMOS transistor PT3 is turned off, while the PMOS transistor PT2 is turned on.

The resistance value Rstb of the resistance between the high-side power source VDDB and the node N1 is given by the following expression.

$$1/Rstb=1/Ron2 \qquad \text{expression (4)}$$

Because the on-resistance Ron2 of the PMOS transistor PT2 is set at a high value, the impedance at the node N1 can be set to be high. Thus, the voltage at the node N1 is considerably lowered, as compared with the VDDB-voltage. For example, if the static electricity is added on the transmission line transmitting the second signal S2, the voltage difference between the gate and the source (or the node N1) of the PMOS transistor PT1 constituting the inverter is reduced. As a result, the ESD withstanding capability of the second circuit portion 2 is enhanced.

As described above, the semiconductor device according to the present embodiment includes the first circuit portion 1, to which the VDDA-voltage of the first power domain is supplied, and the second circuit portion 2a, to which the VDDB-voltage of the second power domain differing from the first power domain is supplied. The first circuit portion 1 includes the buffer BUFF1. The second circuit portion 2a includes the inverter INV1, the NMOS transistor NT1 and the PMOS transistors PT1 to PT3. The normally-on PMOS transistor PT2 is configured such that the source thereof is connected to the high-side power source VDDB. The PMOS transistor PT3 is configured such that the source thereof is connected to the high-side power source VDDB, and that the fourth signal S4 output from the inverter INV1 is input to the gate thereof. The inverter INV1 is provided between the high-side power source VDDB and the low-side power source VSS and is configured such that the high-side power source VDDA is connected to the input side thereof. The gate withstanding capability of the transistor constituting the inverter INV1 is set to be higher than those of other transistors. The on-resistance of the PMOS transistor PT2 is set to be higher than that of the PMOS transistor PT3. In the normal operation mode, the PMOS transistors PT2 and PT3 are turned on. In the standby mode, the PMOS transistor PT2 is turned on, while the PMOS transistor PT3 is turned off.

In the normal operation mode, since the impedance at the node N1 can be reduced, the characteristic degradation of the inverter including the PMOS transistor PT1 and the NMOS transistor NT1 of the second circuit portion 2a, to which the second signal S2 is input, is suppressed. As a result, the characteristics of the second (receiving-side) circuit portion 2a are favorably maintained. In the standby mode, since the impedance at the node N1 can be increased, the voltage difference between the gate and the source of the PMOS transistor PT1 constituting the inverter is reduced. As a result, the ESD withstanding capability of the second (receiving-side) circuit portion 2a is enhanced.

Embodiment 3

Figure 4:
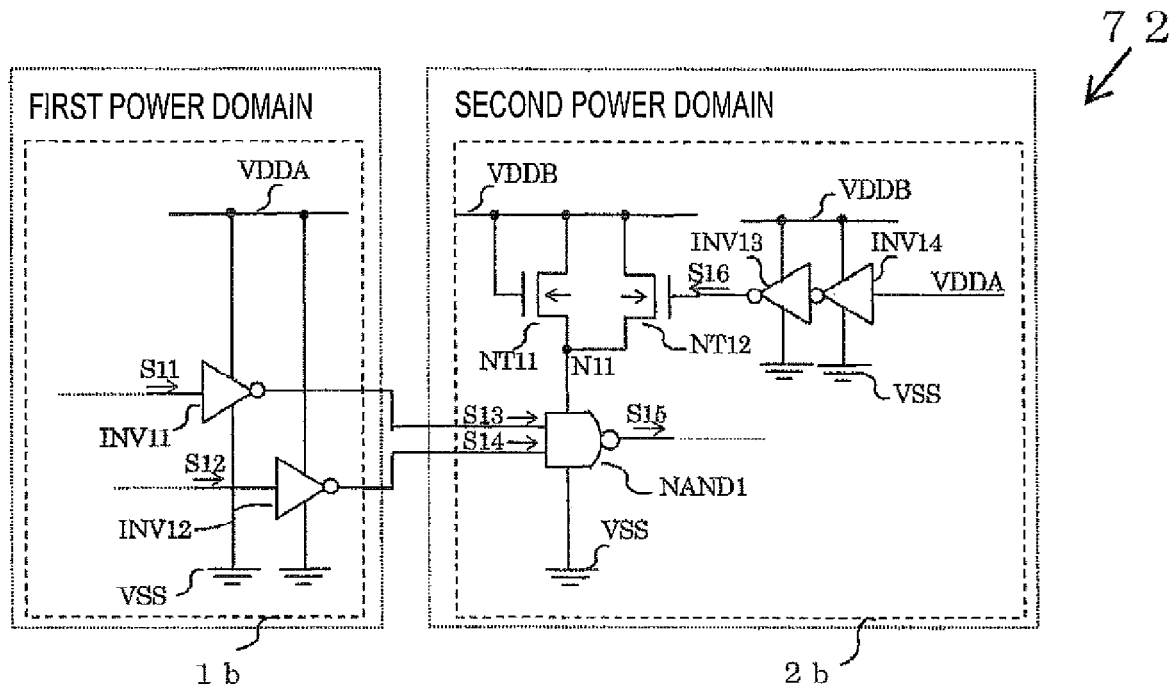
FIG. 4 is a circuit diagram illustrating a semiconductor device according to Embodiment 3 of the invention.

Next, a semiconductor device according to Embodiment 3 of the invention is described below by referring to the accompanying drawings. FIG. 4 is a circuit diagram illustrating the semiconductor device. In the present embodiment, the configuration of each of the first and second circuit portions is changed. The number of signals, which are output from the first circuit portion and are input to the second circuit portion, is increased.

As illustrated in FIG. 4, a semiconductor device 72 includes a first power domain and a second power domain, which are different power domains. The semiconductor device 72 is an SoC provided with, e.g., a memory, a logic circuit, an analog circuit and an input/output circuit. The first power domain includes a first (transmitting-side) circuit portion 1b. The second power domain includes a second (receiving-side) circuit portion 2b. The illustration and the description of an electrostatic discharge (ESD) protection circuit, which protects circuits and elements provided in the first power domain and the second power domain from static electricity, and third or later power domains are omitted herein.

The first circuit portion 1b includes the inverters INV11 and INV12. The inverter INV11 is provided between the high-side power source VDDA of the first power domain and the low-side power source (at a ground level) VSS. Signals S11 generated at the interior or the exterior of the first circuit portion 1b are input to the inverter INV11. The inverter INV11 outputs a signal S13 obtained by inverting the signal S11. The inverter INV12 is provided between the high-side power source VDDA of the first power domain and the low-side power source VSS. A signal S12 generated at the interior or the exterior of the first circuit portion 1b is input to the inverter INV12. A signal S14 obtained by inverting the signal S12 is output by the inverter INV12.

The second circuit portion 2b includes a two-input NAND circuit NAND1, an inverter INV13, an inverter INV14, an NMOS transistor NT11 and an NMOS transistor NT12.

The NMOS transistor NT11 is such that the drain (first terminal) thereof is connected to the high-side power source VDDB of the second power domain differing from the first power domain, that the gate (control terminal) thereof is connected to the high-side power source VDDB, and that the source (second terminal) thereof is connected to the node N11. The NMOS transistor NT11 is a normally-on transistor that is always turned on when the VDDB-voltage is supplied thereto.

The NMOS transistor NT12 is such that the drain (first terminal) thereof is connected to the high-side power source VDDB, that a signal S16 is input to the gate (control terminal) thereof, and that the drain (first terminal) is connected to the node N11. The NMOS transistor NT12 is turned on when the level of the signal S16 is a "High" level, while the NMOS transistor NT12 is turned off when the level of the signal S16 is a "Low" level.

The two-input NAND circuit NAND1 is provided between the node N11 and the low-side power source VSS. A signal S13 output from the inverter INV11 and a signal S14 output from the inverter INV12 are input to the NAND circuit NAND1. Then, the NAND circuit NAND1 outputs a signal S15 obtained by performing a logical operation.

The inverter INV14 is provided between the high-side power source VDDB and the low-side power source VSS such that the VDDA-voltage is input to an input side thereof, and that the inverter INV14 outputs a signal obtained by a VDDA-voltage signal. The inverter INV13 is provided between the high-side power source VDDB and the low-side power source VSS such that a signal output from the inverter INV14 is input to the inverter INV13, and that a signal S16 obtained as an inverted signal is output to the gate of the NMOS transistor NT12.

The inverters INV13 and INV14 are functioning as a control circuit. The normally-on NMOS transistor NT11, the normally-off NMOS transistor NT12 and the inverters INV13 and INV14 are functioning as a protection circuit.

The gate withstand voltage of transistors constituting the inverters INV13 and INV14 are set to be higher than those of other transistors, such as transistors constituting the inverters INV11 and INV12, the two-input NAND circuit NAND1 and the NMOS transistors NT11 and NT12. To enhance the gate withstand voltages of the transistors constituting the inverters INV13 and INV14, the EOT of a gate insulating film is formed to be thicker than gate insulating films of other transistors.

In the present embodiment, the size of the NMOS transistor NT12 is set to be larger than that of the NMOS transistor NT11. For example, in a case where the gate length (Lg) of the NMOS transistor NT11 is equal to that of the NMOS transistor NT12, the gate width (Wg) of the NMOS transistor NT12 is set to be wider than that of the NMOS transistor NT11.

Next, an operation of the second (receiving-side) circuit portion 2b in a normal operation mode and in a standby mode is described below. The normal operation mode corresponds to a case where the VDDA-voltage of the first power domain is supplied to the first circuit portion 1b, where the VDDB-voltage of the second power domain is supplied to the second circuit portion 2b, where the second signal S13 output from the inverter INV11 is input to the second circuit portion 2b, where the signal S14 is input from the inverter INV12 to the second circuit portion 2b, and where the VDDA-voltage is input to the input side of the inverter INV14.

The standby mode corresponds to a case where conditions for establishing the normal operation mode are not satisfied, e.g., a case where the VDDA-voltage is not input to the input side of the inverter INV14, or where the VDDB-voltage is not supplied thereto.

In the normal operation mode of the second circuit portion 2b, the signal level of the signal S16 is a "High" level, so that the NMOS transistor NT12 is turned on, and that the NMOS transistor NT11 is turned on.

The relationship between the on-resistance Ron11 of the NMOS transistor NT11 and that Ron12 of the NMOS transistor NT12 is set to be as follows.

$$Ron11 \gg Ron12 \qquad \text{expression (5)}$$

Thus, the resistance value Rrega of the resistance in the normal operation mode between the high-side power source VDDB and the node N11 is given as to satisfy the following expressions.

$$1/Rrega = (1/Ron11) + (1/Ron12) \qquad \text{expression (6)}$$

$$1/Rrega \cong 1/Ron12 \qquad \text{expression (7)}$$

The on-resistance Ron12 of the NMOS transistor NT12 is set at a small value. Thus, the impedance at the node N11 can be set to be low. The voltage at the node N11 can be set to be substantially equal to the VDDB-voltage. Accordingly, reduction in the voltage applied to the two-input NAND circuit NAND1 of the second circuit portion 2b can be suppressed, and a given operation is maintained. As a result, the characteristics of the second circuit portion 2a are favorably maintained.

On thioether hand, in the standby mode of the second circuit portion 2b, the signal level of the fourth signal S16 is a "Low" level, so that the NMOS transistor NT12 is turned off, while the NMOS transistor NT11 is turned on.

The resistance value Rstba of the resistance between the high-side power source VDDB and the node N11 is given by the following expression.

$$1/Rstba = 1/Ron11 \qquad \text{expression (8)}$$

Because the on-resistance Ron11 of the NMOS transistor NT11 is set at a high value, the impedance at the node N11 can be set to be high. Thus, the voltage at the node N11 is considerably lowered, as compared with the VDDB-voltage. For example, if the static electricity is added on the transmission line transmitting the signals S13 and S14, the voltage difference between the gate and the source (or the node N11) of the PMOS transistor constituting the two-input NAND circuit NAND1 is reduced. As a result, the ESD withstanding capability of the second circuit portion 2b is enhanced.

As described above, the semiconductor device according to the present embodiment includes the first circuit portion 1b, to which the VDDA-voltage of the first power domain is supplied, and the second circuit portion 2b, to which the VDDB-voltage of the second power domain differing from the first power domain is supplied. The first circuit portion 1b includes the inverters INV11 and INV12. The second circuit portion 2b includes the two-input NAND circuit NAND1, the inverters INV13 and INV14, the NMOS transistor NT11 and the NMOS transistor NT12. The normally-on NMOS transistor NT11 is configured such that the drain thereof is connected to the high-side power source VDDB. The NMOS transistor NT12 is configured such that the drain thereof is connected to the high-side power source VDDB, and that the fourth signal S16 output from the inverter INV13 is input to the gate thereof. The inverter INV14 is provided between the high-side power source VDDB and the low-side power source VSS and is configured such that the VDDA-voltage is connected to the input side thereof. The inverter INV13 is provided between the high-side power source VDDB and the low-side power source VSS, and the signal output from the inverter INV14 is input. The gate withstanding capability of the transistor constituting each of the inverters INV13 and INV14 is set to be higher than those of other transistors. The on-resistance of the NMOS transistor NT11 is set to be higher than that of the NMOS transistor NT12. In the normal operation mode, the NMOS transistors NT11 and NT12 are turned on. In the standby mode, the NMOS transistor NT11 is turned on, while the NMOS transistor NT12 is turned off.

In the normal operation mode, since the impedance at the node N11 can be reduced, the characteristic degradation of the two-input NAND circuit NAND1 of the second circuit portion 2b, to which the signals S13 and S14 are input, is suppressed. As a result, the characteristics of the second (receiving-side) circuit portion 2b are favorably maintained. In the standby mode, since the impedance at the node N11 can be increased, the voltage difference between the gate and the source of the PMOS transistor constituting the two-input NAND circuit NAND1 is reduced. As a result, the ESD withstanding capability of the second (receiving-side) circuit portion 2b is enhanced.

In the present embodiment, the first circuit portion 1b and the second circuit portion 2b are constituted by the MOS transistors. However, MIS transistors may be used, instead of the MOS transistors.

Embodiment 4

Figure 5:
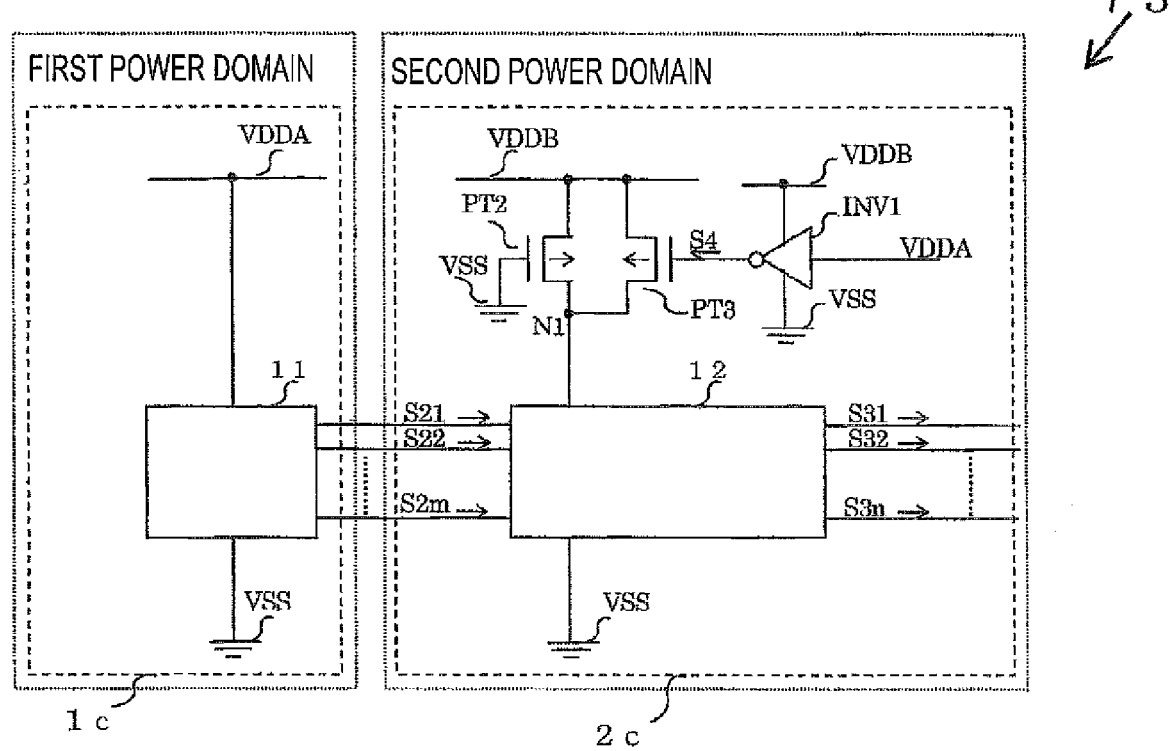
FIG. 5 is a circuit diagram illustrating a semiconductor device according to Embodiment 4 of the invention.

Next, a semiconductor device according to Embodiment 4 of the invention is described below by referring to the accompanying drawings. FIG. 5 is a circuit diagram illustrating the semiconductor device. In the present embodiment, the configuration of each of the first and second circuit portions is changed. The number of signals output from the first circuit portion and input to the second circuit portion and the number of signals output from the second circuit block are increased.

Hereinafter, each constituent element which is the same as that of Embodiment 2 is designated with the same reference numeral as that used in the description of Embodiment 2. Thus, the description of such constituent elements is omitted. In the following description, the differences between Embodiment 4 and Embodiment 2 are described below.

As illustrated in FIG. 5, a semiconductor device 73 includes a first power domain and a second power domain, which are different power domains. The semiconductor device 73 is an SoC provided with, e.g., a memory, a logic circuit, an analog circuit and an input/output circuit. The first power domain includes a first (transmitting-side) circuit portion 1c. The second power domain includes a second (receiving-side) circuit portion 2c. The illustration and the description of an electrostatic discharge (ESD) protection circuit, which protects circuits and elements provided in the first power domain and the second power domain from static electricity, and third or later power domains are omitted herein.

The first circuit portion 1c includes a first circuit block 11. The first circuit block 11 is provided between the high-side power source VDDA and the low-side power source (at a ground level) VSS of the first power domain. The first circuit block 11 includes a plurality of circuits and elements and outputs m types of signals S21, S22, . . . and S2m.

The second circuit portion 2c includes the second circuit block 12, the inverter INV1, the PMOS transistor PT2 and the PMOS transistor PT3.

The second circuit block 12 is provided between the node N1 and the low-side power source VSS, and includes a plurality of circuits and elements. M-types of signals S21, S22, . . . and S2m output from the first circuit block 11 are input to the second circuit block 12, and the second circuit block 12 outputs n-types of processed signals S31, S32, . . . and S3n.

Next, an operation of the second (receiving-side) circuit portion 2c in a normal operation mode and in a standby mode is described below. The normal operation mode corresponds to a case where the VDDA-voltage of the first power domain is supplied to the first circuit portion 1c, where the VDDB-voltage of the second power domain is supplied to the second circuit portion 2c, where the m-types of signals S21, S22, . . . and S2m are input from the first circuit portion 1c to the second circuit portion 2c, and where the VDDA-voltage is input to the input side of the inverter INV1.

The standby mode corresponds to a case where conditions for establishing the normal operation mode are not satisfied, e.g., a case where the VDDA-voltage is not input to the input side of the inverter INV1, or where the VDDB-voltage is not supplied thereto.

In the normal operation mode of the second circuit circuit portion 2c, the signal level of the fourth signal S4 is a "Low" level, so that the PMOS transistor PT3 is turned on, and that the PMOS transistor PT2 is turned on. Thus, the voltage applied to the second circuit block 12 of the second circuit portion 2c is substantially equal to the VDDB-voltage. Consequently, the signal level reduction or the signal delay of the n-type of signals S31, S32, . . . and S3n output from the second circuit block 12 is suppressed, and a given operation is maintained. As a result, the characteristics of the second circuit portion 2c are favorably maintained.

On the other hand, in the standby mode of the second circuit portion 2c, the signal level of the fourth signal S4 is a "High" level, so that the PMOS transistor PT3 is turned off, while the PMOS transistor PT2 is turned on. For example, if the static electricity is added on the transmission line transmitting the m-type signals S21, S22, . . . and S2m output from the first circuit block 11, the voltage difference between the gate and the source (or the node N1) of the PMOS transistor, which constitutes the second circuit block 12, at the high-side power source VDDB side is reduced. As a result, the ESD withstanding capability of the second circuit portion 2c is enhanced.

As described above, the semiconductor device according to the present embodiment includes the first circuit portion 1c, to which the VDDA-voltage of the first power domain is supplied, and the second circuit portion 2c, to which the VDDB-voltage of the second power domain differing from the first power domain is supplied. The first circuit portion 1c includes the first circuit block 11. The first circuit block 11 outputs the m-type signals S21, 522, . . . and S2m. The second circuit portion 2c includes the second circuit block 12, the inverter INV1, the PMOS transistor PT2 and the PMOS transistors PT3. The m-type signals S21, S22, . . . and S2m are input to the second circuit block 12. Further, the second circuit block 12 outputs the n-type signals S31, S32, . . . and S3n. The normally-on PMOS transistor PT2 is configured such that the source thereof is connected to the high-side power source VDDB. The PMOS transistor PT3 is configured such that the source thereof is connected to the high-side power source VDDB, and that the fourth signal S4 output from the inverter INV1 is input to the gate thereof. The inverter INV1 is provided between the high-side power source VDDB and the low-side power source VSS and is configured such that the high-side power source VDDA is connected to the input side thereof. The gate withstanding capability of the transistor constituting the inverter INV1 is set to be higher than those of other transistors. The on-resistance of the PMOS transistor PT2 is set to be higher than that of the PMOS transistor PT3. In the normal operation mode, the PMOS transistors PT2 and PT3 are turned on. In the standby mode, the PMOS transistor PT2 is turned on, while the PMOS transistor PT3 is turned off.

In the normal operation mode, since the impedance at the node N1 can be reduced, the characteristic degradation of the second circuit block 12 of the second circuit portion 2c, to which the m-type of signals S21, S22, . . . and S2m are input, is suppressed. As a result, the characteristics of the second (receiving-side) circuit portion 2c are favorably maintained. In the standby mode, since the impedance at the node N1 can be increased, the voltage difference between the gate and the source of, e.g., the PMOS transistor constituting the second circuit block 12 is reduced. As a result, the ESD withstanding capability of the second (receiving-side) circuit portion 2c is enhanced.

The invention is not limited to the aforementioned embodiments. The invention can variously be modified without departing from the spirit thereof.

For example, although the aforementioned embodiments are applied to SoCs, the aforementioned embodiments may be applied to a system LSI and a multi chip package (MCP).

According to an aspect of the invention, in a semiconductor device having a plurality of power domains, the ESD capability of a signal-receiving-side circuit portion can be enhanced while maintaining the characteristics.

What is claimed is:

1. A semiconductor device comprising:
    a first circuit portion including:
    a first circuit that is connected between a first high-side power line and a low-side power line and that outputs a second signal based on a first signal input thereto; and
    a second circuit portion including:
    a first transistor that is connected between a second high-side power line and a node and that has a normally-on characteristic;
    a second circuit that is connected between the node and the low-side power line and that outputs a third signal based on the second signal input thereto, wherein the second circuit portion further includes:
        a control circuit that is connected between the second high-side power line and the low-side power line and that outputs a fourth signal based on a voltage of the first high-side power line; and
        a second transistor that is connected between the second high-side power line and the node and that has a control terminal to which the fourth signal is input.

2. The semiconductor device according to claim 1 wherein the control circuit includes a transistor that is higher in a gate withstand voltage than that of transistors included in the first circuit and the second circuit, that of the first transistor and that of the second transistor.

3. The semiconductor device according to claim 1, wherein the control circuit includes a transistor that has a gate-insulating-film EOT larger than that of transistors included in the first circuit and the second circuit, that of the first transistor and that of the second transistor.

4. The semiconductor device according to claim 1, wherein the first transistor has an on-resistance larger than that of the second transistor.

5. The semiconductor device according to claim 1, wherein the second transistor is in a turn-on state when the second circuit is in an operating state, and
    wherein the second transistor is in a turn-off state when the second circuit is in a non-operating state.

6. The semiconductor device according to claim 1, wherein the first transistor is a PMOS transistor, wherein the first transistor includes a control terminal connected to the low-side power line.

7. The semiconductor device according to claim 1, wherein the first transistor is an NMOS transistor, wherein the first transistor includes a control terminal connected to the second high-side power line.

8. The semiconductor device according to claim 1, wherein the second transistor is a PMOS transistor, wherein the control circuit includes:
    an inverter that outputs the fourth signal based on the voltage of the first high-side power line input thereto.

9. The semiconductor device according to claim 1, wherein the second transistor is an NMOS transistor, wherein the control circuit includes:
    a first inverter that outputs a fifth signal based on the voltage of the first high-side power line input thereto; and
    a second inverter that outputs the fourth signal based on the fifth signal input thereto.

10. A semiconductor device comprising:
    a first circuit that is connected between a first high-side power line and a low-side power line and that sends a data signal; a protection circuit including:
    a first transistor that is connected between a second high-side power line and a node and that has a normally-on characteristic;
    a control circuit that is connected between the second high-side power line and the low-side power line and that outputs a control signal based on a voltage of the first high-side power line; and
    a second transistor that is connected between the second high-side power line and the node and that has a control terminal to which the control signal is input; and
    a second circuit that is connected between the node and the low-side power line and that receives the data signal.

11. The semiconductor device according to claim 10, wherein the first transistor is a PMOS transistor, wherein the first transistor includes a control terminal connected to the low-side power line.

12. The semiconductor device according to claim 10, wherein the first transistor is an NMOS transistor, wherein the first transistor includes a control terminal connected to the second high-side power line.

13. The semiconductor device according to claim 10, wherein the second transistor is a PMOS transistor, wherein the control circuit includes:
    an inverter that outputs the control signal based on the voltage of the first high-side power line input thereto.

14. The semiconductor device according to claim 10, wherein the second transistor is an NMOS transistor, wherein the control circuit includes:
    a first inverter that outputs an inverted signal based on the voltage of the first high-side power line input thereto; and
    a second inverter that outputs the control signal based on the inverted signal input thereto.

15. A method for designing a semiconductor device, the method comprising:
    disposing a first circuit that is connected between a first high-side power line and a lowside power line and that sends a data signal;
    disposing a protection circuit including a first transistor that is connected between a second high-side power line and a node and that has a normally-on characteristic;
    disposing a second circuit that is connected between the node and the low-side power line and that receives the data signal, wherein the protection circuit further includes:
    a control circuit that is connected between the second high-side power line and the lowside power line and that outputs a control signal based on a voltage of the first high-side power line; and
    a second transistor that is connected between the second high-side power line and the node and that has a control terminal to which the control signal is input.

* * * * *